US008450856B2

(12) United States Patent
Kang et al.

(10) Patent No.: US 8,450,856 B2
(45) Date of Patent: May 28, 2013

(54) SEMICONDUCTOR DEVICE AND METHOD OF FORMING THE SAME

(75) Inventors: Un-Byoung Kang, Hwaseong-si (KR); Kwang-chul Choi, Suwon-si (KR); Jung-Hwan Kim, Bucheon-si (KR); Tae Hong Min, Gumi-si (KR); Hojin Lee, Hwaseong-si (KR); Minseung Yoon, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 4 days.

(21) Appl. No.: 13/240,533

(22) Filed: Sep. 22, 2011

(65) Prior Publication Data
US 2012/0153498 A1  Jun. 21, 2012

(30) Foreign Application Priority Data
Dec. 16, 2010  (KR) .......................... 10-2010-0129238

(51) Int. Cl.
*H01L 23/48* (2006.01)
(52) U.S. Cl.
USPC .............. 257/774; 257/E23.011; 257/773; 257/784; 257/786; 257/737; 257/738; 257/778; 257/780; 257/779; 257/792
(58) Field of Classification Search
USPC ............ 257/774, E23.011, 773, 784, 786, 257/737, 738, 778, 780, 779, 782, 7, 73
See application file for complete search history.

(56) References Cited

U.S. PATENT DOCUMENTS

| 2006/0205204 | A1* | 9/2006 | Beck | 438/628 |
|---|---|---|---|---|
| 2008/0157380 | A1* | 7/2008 | Hong | 257/751 |
| 2008/0284041 | A1* | 11/2008 | Jang et al. | 257/774 |
| 2009/0026566 | A1 | 1/2009 | Oliver et al. | |
| 2010/0013082 | A1* | 1/2010 | Lin | 257/692 |
| 2011/0026232 | A1* | 2/2011 | Lin et al. | 361/760 |
| 2011/0101532 | A1* | 5/2011 | Pohl et al. | 257/758 |
| 2012/0252208 | A1* | 10/2012 | Jang et al. | 438/653 |

FOREIGN PATENT DOCUMENTS

| KR | 1020070035205 A | 3/2007 |
|---|---|---|
| KR | 100871388 B1 | 11/2008 |
| KR | 1020100061456 A | 6/2010 |

\* cited by examiner

*Primary Examiner* — A O Williams
(74) *Attorney, Agent, or Firm* — Muir Patent Consulting, PLLC

(57) ABSTRACT

In a semiconductor device, an organic insulation pattern is disposed between first and second rerouting patterns. The organic insulation pattern may absorb the physical stress that occurs when the first and second rerouting patterns expand under heat. Since the organic insulation pattern is disposed between the first and second rerouting patterns, insulating properties can be increased relative to a semiconductor device in which a semiconductor pattern is disposed between rerouting patterns. Also, since a seed layer pattern is disposed between the first and second rerouting patterns and the organic insulation pattern and between the substrate and the organic insulation pattern, the adhesive strength of the first and second rerouting patterns is enhanced. This also reduces any issues with delamination. Also, the seed layer pattern prevents the metal that forms the rerouting pattern from being diffused to the organic insulation pattern. Therefore, a semiconductor device with enhanced reliability may be implemented.

14 Claims, 21 Drawing Sheets

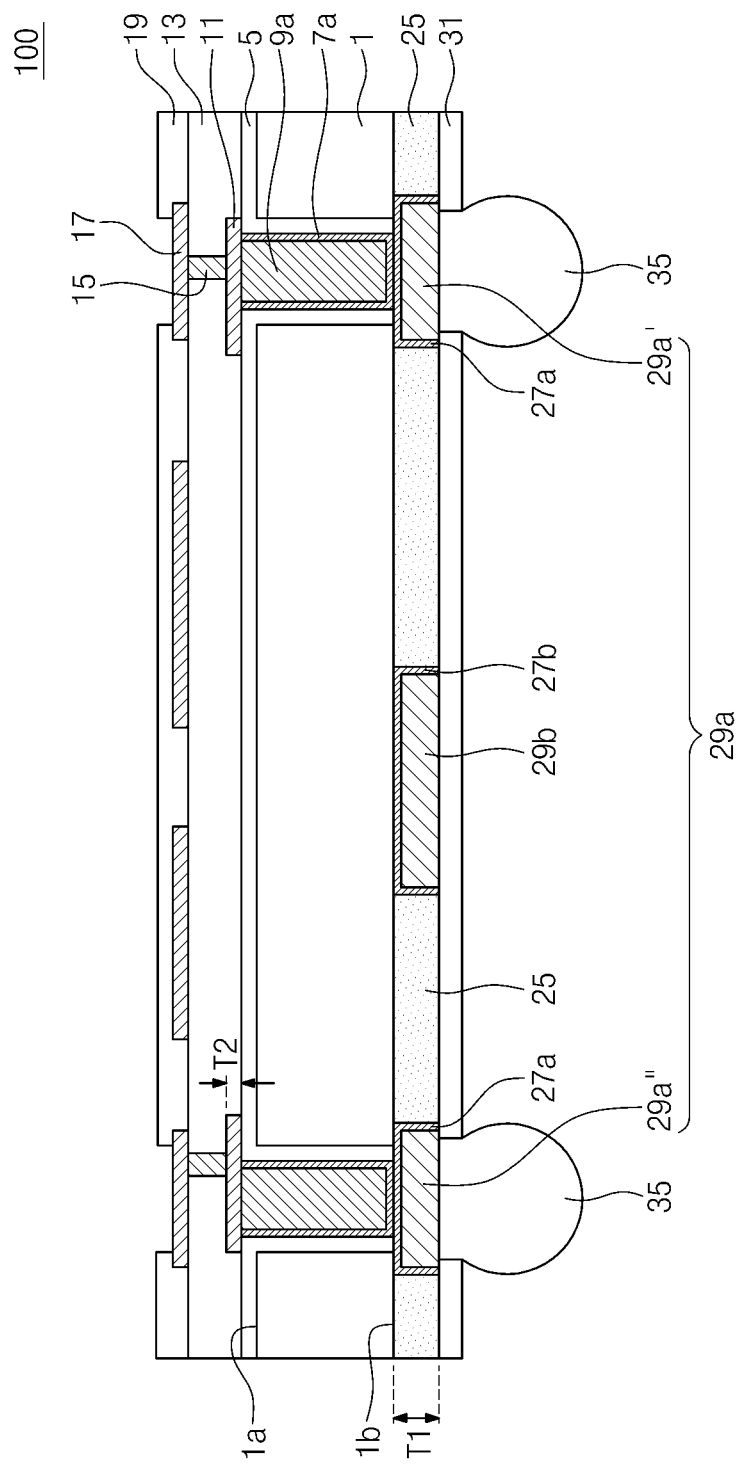

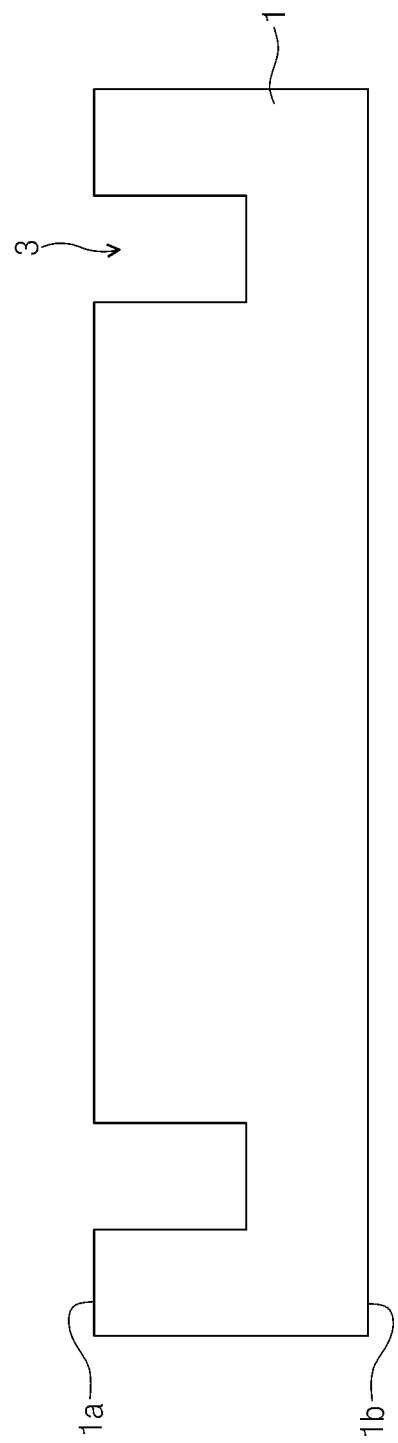

SEMICONDUCTOR DEVICE AND METHOD OF FORMING THE SAME

CROSS-REFERENCE TO RELATED APPLICATIONS

This U.S. non-provisional patent application claims priority under 35 U.S.C. §119 of Korean Patent Application No. 10-2010-0129238, filed on Dec. 16, 2010, the entire contents of which are hereby incorporated by reference.

BACKGROUND

The present disclosure herein relates to a semiconductor device and a method of forming the same.

A major technological development trend in the semiconductor industry is the miniaturization of semiconductor devices. Also, in the semiconductor device package field, semiconductor device packages such as a Fine pitch Ball Grid Array (FBGA) or Chip Scale Package (CSP), which have a small size and a plurality of pins, are being developed due to the rapid increase in demand for small computers and portable electronic devices.

While semiconductor device packages currently being developed such as Fine pitch Ball Grid Arrays and Chip Scale Packages have the physical advantages of small size and light weight, their reliability may not yet match that of typical plastic packages, and the high cost raw materials and processes used in their fabrication lowers their cost-competitiveness. In particular, the so-called micro Ball Grid Array (µBGA) package, a representative chip scale package, while having more favorable characteristics than the fine pitch ball grid array or chip scale package, may suffer from low reliability and cost-competitiveness.

As a type of package developed to overcome these limitations, the so-called Wafer Level CSP (WL-CSP) is based on the redistribution or rerouting of a bonding pad of a semiconductor chip.

A wafer level chip scale package employing redistribution may include a bonding pad on a semiconductor chip that is connected to another pad of greater size during semiconductor device fabrication (FAB), after which an external connection terminal such as a solder ball or bonding wire is formed on the pad.

SUMMARY

The present disclosure provides a semiconductor device which has enhanced reliability.

In an exemplary embodiment, a method of manufacturing a semiconductor device comprises the steps of: providing a semiconductor substrate, the semi conductor substrate having an active surface at which an integrated circuit is formed and a backside surface opposite the active surface; forming an organic insulation layer on the backside surface, the organic insulation layer having at least one opening; forming a seed layer on the organic insulation layer and within the at least one opening; electroplating the semiconductor substrate to form a conductive layer on the seed layer including within the at least one opening; and planarizing the conductive layer to remove at least a portion of the seed layer and at least a portion of the conductive layer on the organic insulation layer, wherein a portion of the conductive layer that remains in the at least one opening after planarizing forms at least one of a chip pad and a wiring.

In an exemplary embodiment, a semiconductor device comprises: a semiconductor substrate having an active surface at which an integrated circuit is formed and a backside surface opposite the active surface; a first organic insulation pattern disposed on the backside surface, the first organic insulation pattern having at least a first opening; a first seed layer pattern disposed on sidewalls of the first opening of the first organic insulation pattern; an electroplated conductive pattern formed within the opening, the seed layer being disposed between the conductive pattern and the sidewalls of the opening, the conductive pattern comprising at least one of a chip pad and a wiring; and a through substrate via extending through the semiconductor substrate and electrically connected to the conductive pattern.

BRIEF DESCRIPTION OF THE DRAWINGS

The above and other aspects and features of the disclosure will become more apparent by describing in detail exemplary embodiments thereof with reference to the attached drawings, in which:

FIG. 1B is a sectional view taken along the I-I' line of a semiconductor device of FIG. 1A;

FIGS. 2 to 12 are process sectional views illustrating a process of manufacturing the semiconductor device of FIG. 1;

DETAILED DESCRIPTION OF THE EMBODIMENTS

Figure 1A:
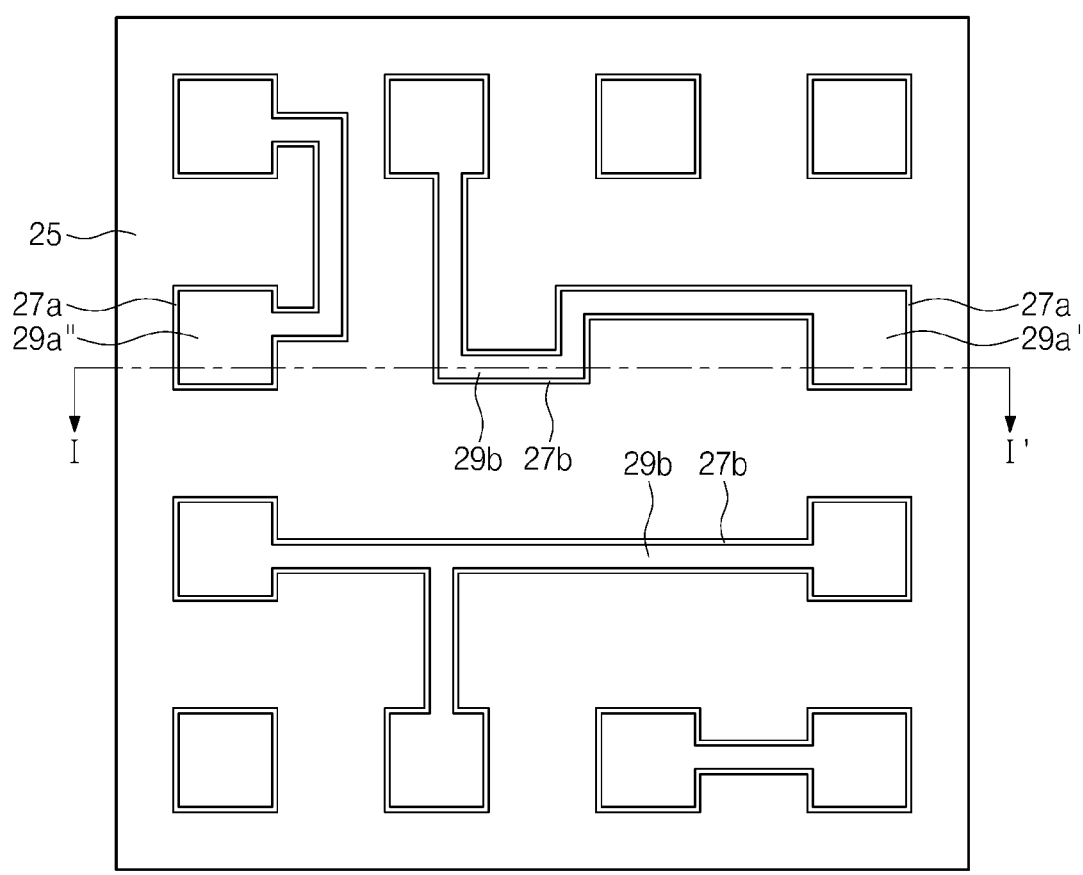
FIG. 1A is a plan view of showing a backside of the semiconductor device according to an embodiment.

The present disclosure will be described below in more detail with reference to the accompanying drawings, in which various embodiments are shown. The invention may, however, be embodied in many different forms and should not be construed as limited to the embodiments set forth herein. In the drawings, the sizes and relative sizes of layers and regions are exaggerated for clarity of illustration. Like numbers refer to like elements throughout.

It will also be understood that when an element or layer (or film) is referred to as being 'on' or 'connected to' another element or layer or substrate, it can be directly on the other element or layer or substrate, or intervening elements or layers may also be present. In contrast, when an element is referred to as being 'directly connected' or 'in contact' to another element, there are no intervening elements present.

As used herein, the term "and/or" includes any and all combinations of one or more of the associated listed items and may be abbreviated "/".

It will be understood that, although the terms first, second, etc., may be used herein to describe various elements, these elements should not be limited by these terms. Unless indicated otherwise, these terms are only used to distinguish one element from another. For example, a first layer could be termed a second layer, and, similarly, a layer chip could be termed a layer chip without departing from the teachings of the disclosure.

The terminology used herein is for the purpose of describing particular embodiments only and is not intended to be limiting of the invention. As used herein, the singular forms "a", "an", and "the" should not exclude the plural forms as well, unless the context clearly indicates otherwise. It will be further understood that the terms "comprises" and/or "comprising" or "includes" and/or "including" when used in this specification, specify the presence of stated features, regions, integers, steps, operations, elements and/or components, but do not preclude the presence of addition of one or more other features, regions, integers, steps, operations, elements, components and/or groups thereof.

Spatially relative terms, such as "beneath", "below", "lower", "above", "upper" and the like, may be used herein for ease of description to describe one element's or feature's relationship to another element(s) or feature(s) as illustrated in the figures. It will be understood that the locational terms may be relative to a device and are intended to encompass different orientations of the device in use or operation in addition to the orientation depicted in the figures. For example, if the device in the figures is turned over, elements described as "below" or "beneath" other elements or features should still be considered to have such an orientation. Thus, the term "below" can encompass both an orientation of above and below. The device may be otherwise oriented (rotated 90 degrees or at other orientations) and the locational descriptors used herein interpreted in the same manner.

Unless otherwise defines, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art/or or the present application, and should not be interpreted in an idealized or overly formal sense unless expressly defined so herein.

Hereinafter, exemplary embodiments will be described more fully in detail with reference to the accompanying drawings.

First Embodiment

FIG. 1A is a plan view showing a backside of the semiconductor device according to a first embodiment.

FIG. 1B is a sectional view taken along the line I-I' of a semiconductor device of FIG. 1A.

Referring to FIGS. 1A and 1B, a substrate 1 included in a semiconductor device 100 according to the first embodiment may include mutually opposite first and second surfaces 1a and 1b. In one embodiment, the semiconductor device 100 may be disposed on the backside of a wafer. In one embodiment, the semiconductor device 100 may be disposed on a non-active surface of the wafer. The substrate 1 may include one of a semiconductor material or an insulation material. The semiconductor device 100 may include a through via 9a connecting the first and second surfaces 1a and 1b through the substrate 1. An internal seed layer pattern 7a may be disposed between the through via 9a and the substrate 1. An insulation layer liner 5 may be disposed between the internal seed layer pattern 7a and the substrate 1. The internal seed layer pattern 7a may further include a diffusion barrier and/or wetting layer. The diffusion barrier may include at least one selected from the group consisting of a titanium layer, a titanium nitride layer, a tantalum layer, and a tantalum nitride layer.

The insulation layer liner 5 may be extended on the first surface 1a. The insulation layer liner 5, for example, may include a silicon oxide layer. An interlayer dielectric 13, internal routings 11, and contacts 15 may be disposed on the first surface 1a. The interlayer dielectric 13, internal routings 11, and contacts 15 may be disposed over a plurality of layers. A bonding pad 17 may be disposed on the interlayer dielectric 13. A first passivation layer 19, which may expose a portion of the bonding pad 17 and cover the interlayer dielectric 13, may be disposed on the first surface 1a of the substrate 1. The first passivation layer 19 may include a silicon nitride layer.

Referring to FIGS. 1A and 1B, first rerouting patterns 29a and second rerouting pattern 29b may be disposed on the second surface 1b of the substrate 1. Although not shown, a passivation layer may be interposed between the substrate 1 and the first and second rerouting patterns 29a and 29b. The first rerouting patterns 29a may include one or more first rerouting patterns; in one embodiment, first rerouting patterns 29a may include first rerouting pattern 29a' and first rerouting pattern 29a". The number of first rerouting patterns 29a is not limited herein; the number of rerouting patterns is any number suitable for use in the semiconductor device being formed. The first rerouting patterns 29a may be ball lands or bonding pads. The second rerouting pattern 29b may be a signal line. The second rerouting pattern 29b may connect the first rerouting patterns 29a to form electrical circuits. The first rerouting patterns 29a and 29b may include copper.

An organic insulation pattern 25 may be disposed between the first and second rerouting patterns 29a and 29b. The organic insulation pattern 25 may be contacted to the second surface 1b of the substrate 1. The organic insulation pattern 25 may include a material based on a photosensitive polymer. For example, the organic insulation pattern 25 may be a polyimide.

The organic insulation pattern 25 may be formed with one or more openings. External seed layer patterns 27a and 27b may be disposed on the sidewalls of the organic insulation pattern 25, with the first and second rerouting patterns 29a and 29b disposed in the openings. The external seed layer patterns 27a and 27b are disposed between the first and second rerouting patterns 29a and 29b and the substrate 1 and between the first and second rerouting patterns 29a and 29b and the organic insulation pattern 25.

The external seed layer patterns 27a and 27b may include a first external seed layer pattern 27a and a second external seed layer pattern 27b. The first external seed layer pattern 27a may be disposed between the first rerouting patterns 29a and the organic insulation pattern 25. The first external seed layer pattern 27a may also be disposed between the substrate 1 and the first rerouting patterns 29a. The second external seed layer pattern 27b may be disposed between the second rerouting pattern 29b and the organic insulation pattern 25 as well as between the substrate 1 and the second rerouting pattern 29b. In one embodiment, the external seed layer patterns 27a and 27b are disposed around the first and second rerouting patterns 29a and 29b such that the first and second rerouting patterns 29a and 29b are not in direct contact with the substrate 1 or the organic insulation pattern 25. The external seed layer patterns 27a and 27b may further include at least one selected from the group consisting of a titanium layer, a titanium nitride layer, a tantalum layer, and a tantalum nitride layer.

The external seed layer patterns 27a and 27b may prevent copper (which forms the first and second rerouting patterns 29a and 29b) from being diffused into the organic insulation pattern 25. Also, the external seed layer patterns 27a and 27b may help the first and second rerouting patterns 29a and 29b to be better bonded to the substrate 1 and the organic insulation pattern 25. In one embodiment, the organic insulation pattern 25 may be formed of a material based on a polymer to be flexible as compared with an inorganic material such as a silicon oxide layer or semiconductor layer. Thus, the organic insulation pattern 25 may be able to absorb the physical stress that occurs when the first and second rerouting patterns 29a and 29b, being metal, may expand in volume due to heat.

The organic insulation pattern 25 may be an insulator having electric resistance higher than a semiconductor. As a detailed example, silicon (as an example of a semiconductor) has an electric resistance of about $10^3$ Ω·m. Polyimide (as an example of the organic insulation pattern 25) has an electric resistance of about $10^{13}$ Ω·m. Accordingly, a semiconductor device in which the organic insulation pattern 25 is disposed between the first and second rerouting patterns 29a and 29b can increase insulating properties compared to a device where the semiconductor pattern is disposed between the first and second rerouting patterns 29a and 29b. Therefore, a semiconductor device with enhanced reliability may be implemented by disposing the organic insulation pattern 25 between the first and second rerouting patterns 29a and 29b.

The organic insulation pattern 25 may have a thickness of about 2 μm or more. The first and second rerouting patterns 29a and 29b may have substantially the same thickness as the organic insulation pattern 25. In one embodiment, the first and second rerouting patterns 29a and 29b may be about 2 μm or more. The thickness of the first and second rerouting patterns 29a and 29b may be greater than the thickness T2 of internal routings 11. The first and second rerouting patterns 29a and 29b may have remarkably low electric resistance relative to the internal routings 11. Signal transmission through the first and second rerouting patterns 29a and 29b may become faster, and thus operation speed may become faster.

A second passivation layer 31 may cover the bottom of the organic insulation pattern 25 and the second rerouting pattern 29b and expose the bottom of the first rerouting patterns 29a. The second passivation layer 31 may be a Photo-solder resist (PSR) layer. The second passivation layer 31 may be formed of the same material as that of the organic insulation pattern 25, or formed of an organic material based on a material identical or similar to the material of the organic insulation pattern 25. Alternatively, the second passivation layer 31 may be formed of an inorganic material different from the organic insulation pattern 25. For example, the second passivation layer 31 may include a silicon nitride layer and serve as a diffusion barrier of the copper which may form the first and second rerouting patterns 29a and 29b. A bump such as a solder ball may be adhered to the first rerouting patterns 29a.

In one embodiment, the semiconductor device 100 may be an interposer. In one embodiment, the interposer may not include an internal device such as a transistor. In another embodiment, the interposer may have integrated circuitry (e.g., logic circuitry) formed within or simply consist of a semiconductor substrate with electrical connections (e.g., as described herein).

FIGS. 2 to 12 are process sectional views illustrating an exemplary process of manufacturing the semiconductor device of FIG. 1B.

Referring to FIG. 2, a semiconductor substrate 1 having a first surface 1a and a second surface 1b is prepared. The semiconductor substrate 1 may be a wafer. In one embodiment, the semiconductor device 100 is formed on a backside of the wafer. In one embodiment, the semiconductor device 100 is formed on a non-active surface of the wafer. In other embodiments, the semiconductor substrate 1 is not a semiconductor substrate; rather the semiconductor substrate may be an insulation material. A through hole 3 is formed by patterning a certain portion of the semiconductor substrate 1. The through hole 3 may be formed using a photolithography or laser. The bottom of the through hole 3 may be spaced apart from the second surface 1b.

Figure 3:
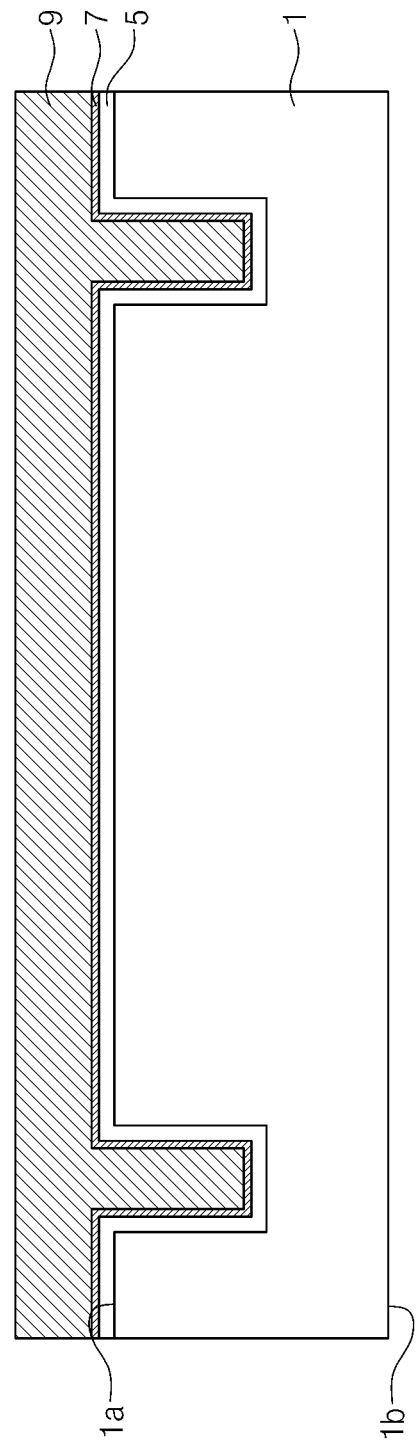

Referring to FIG. 3, an insulation layer liner 5 is conformally formed over the semiconductor substrate 1 in which the through hole 3 is formed. The insulation layer liner 5 may be formed of silicon oxide. An internal seed layer 7 is conformally formed on the insulation layer liner 5. After forming the internal seed layer 7, the through hole 3 is filled by forming a through via conductive layer 9. For example, the through via conductive layer 9 may be formed in a plating process or deposition process.

Figure 4:
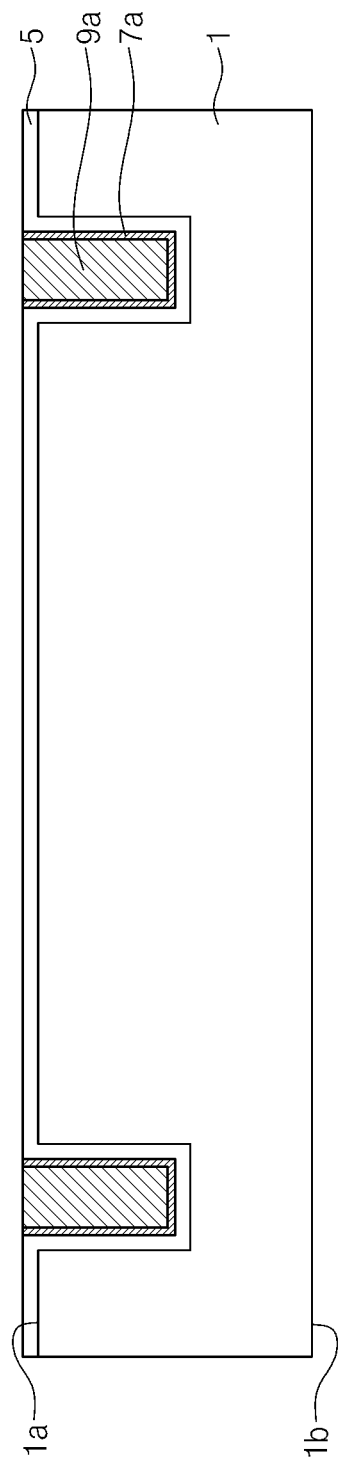

Referring to FIG. 4, an internal seed layer pattern 7a and a through via 9a are formed in the through hole 3 by removing the through via conductive layer 9 and the internal seed layer 7 on the first surface 1a of the semiconductor substrate 1 and exposing the top of the insulation layer liner 5 through a planarization etching process for the through via conductive layer 9 and the internal seed layer 7. The top of the semiconductor substrate 1 may be exposed by removing a portion of the insulation layer liner 5 with the planarization etching process. The planarization etching process may be a CMP (chemical-mechanical planarization) process.

Figure 5:
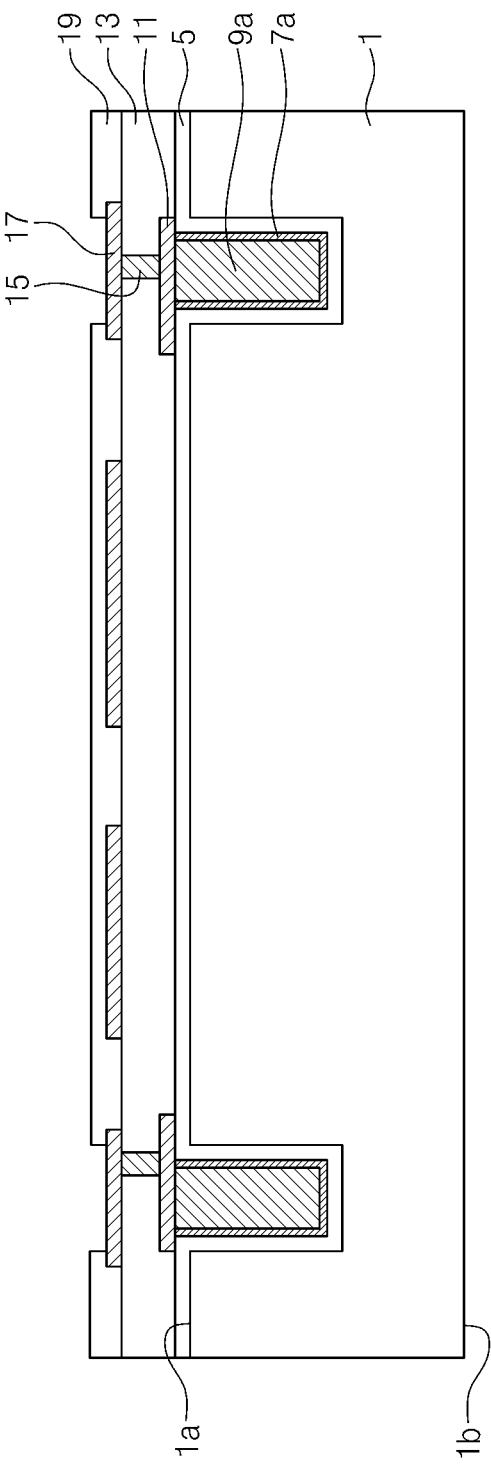

Referring to FIG. 5, the internal routings 11, contacts 15, and an interlayer dielectric 13 are formed on the first surface 1a of the semiconductor substrate 1. A bonding pad 17 is formed on the interlayer dielectric 13. Subsequently, a first passivation layer 19 is formed to expose a portion of the bonding pad 17.

Figure 6:
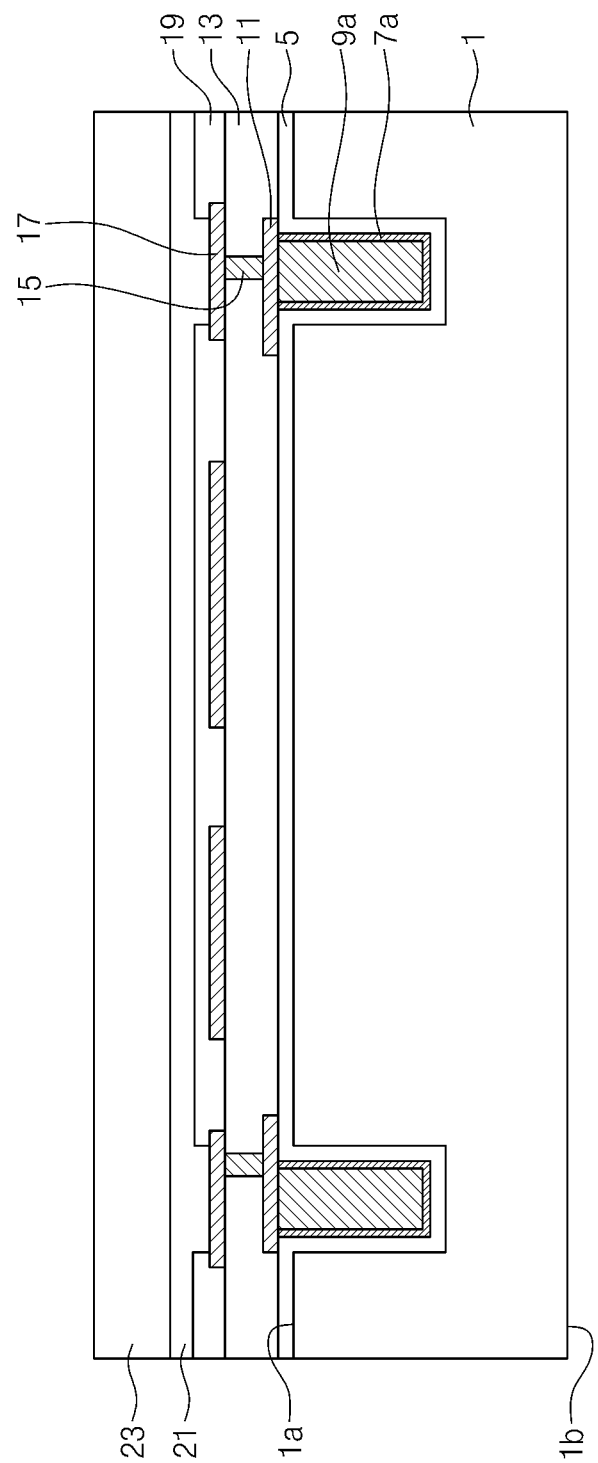

Referring to FIG. 6, a support substrate 23 is adhered onto the first surface 1a of the semiconductor substrate 1 using an adhesive 21. The adhesive may be an adhesive tape.

Figure 7:
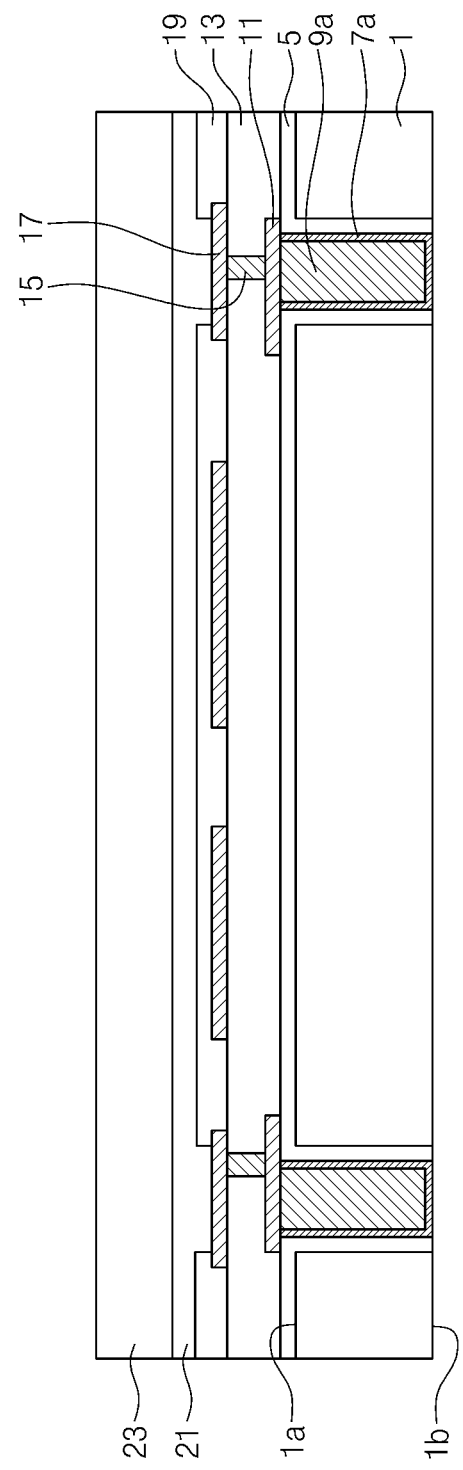

Referring to FIG. 7, the bottom of the internal seed layer pattern 7a is exposed by removing a portion of the semiconductor substrate 1 from the second surface 1b through a grinding process. The bottom of the through via 9a may be exposed through the grinding process.

Figure 8:
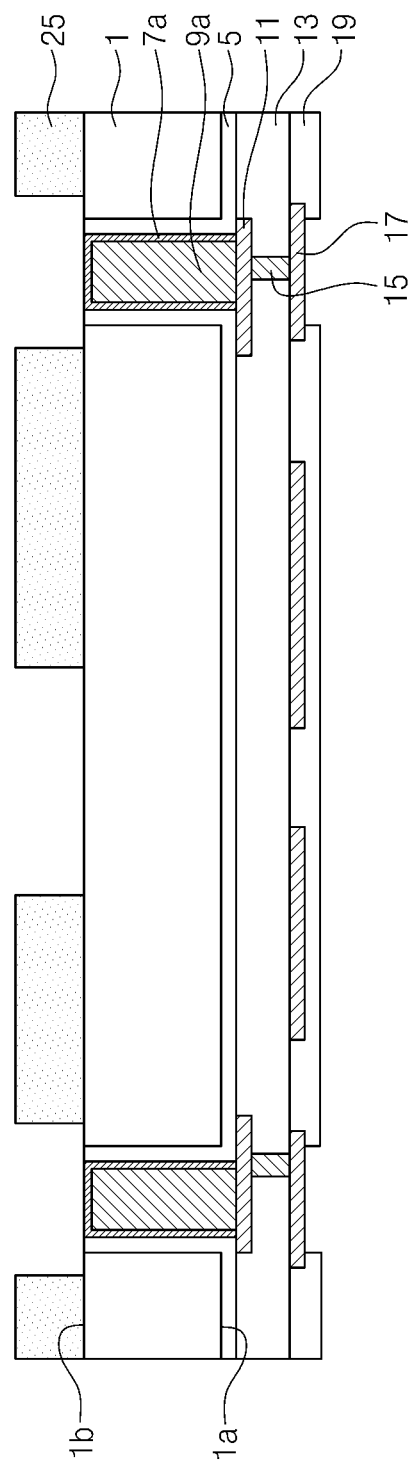

Referring to FIG. 8, the support substrate 23 is separated, and the adhesive 21 is removed. An organic insulation pattern 25 is formed on the second surface of the semiconductor substrate 1 by flipping the semiconductor substrate 1. A material based on a photosensitive polymer is coated, and the organic insulation pattern 25 may be formed through an exposure and development process of a photolithography process using a photo mask. A region where a rerouting pattern will be formed may be defined at the organic insulation pattern 25. The top of the through via 9a may be exposed between the organic insulation pattern 25.

Figure 9:
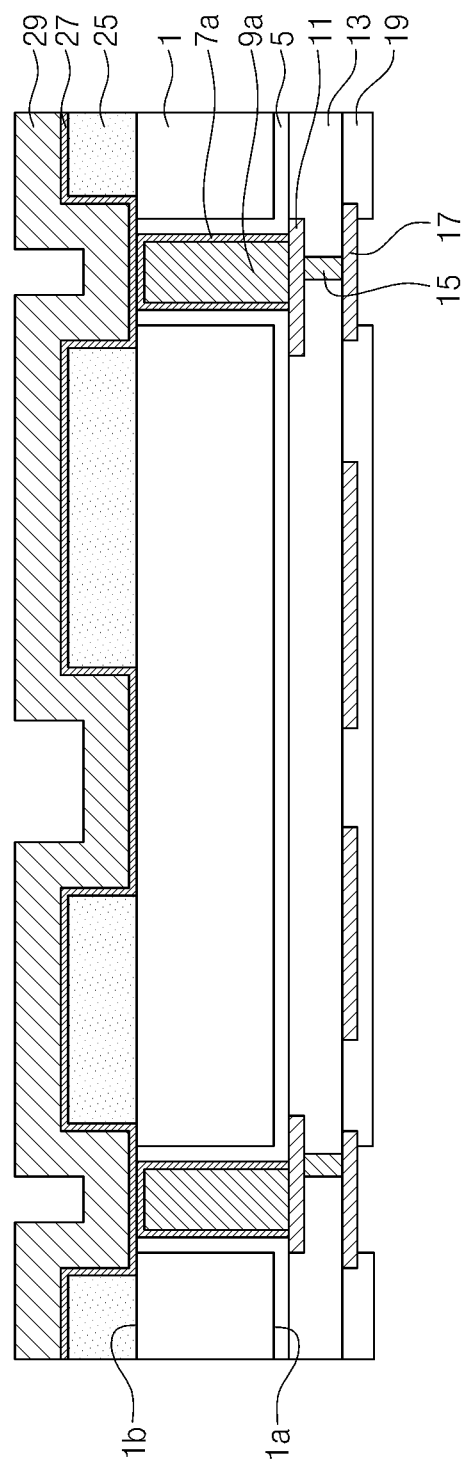

Referring to FIG. 9, an external seed layer 27 is conformally formed on the second surface 1b of the semiconductor substrate 1 in which the organic insulation pattern 25 is formed. For example, the external seed layer 27 may be formed as a double layer including one copper layer and one layer selected from the group consisting of a titanium layer, a titanium nitride layer, a tantalum layer, and a tantalum nitride layer. A rerouting conductive layer 29 is formed on the external seed layer 27. For example, the rerouting conductive layer 29 may be formed of copper and formed in a plating process. In one embodiment, the rerouting conductive layer 29 is formed by electroplating the substrate 1.

Figure 10:
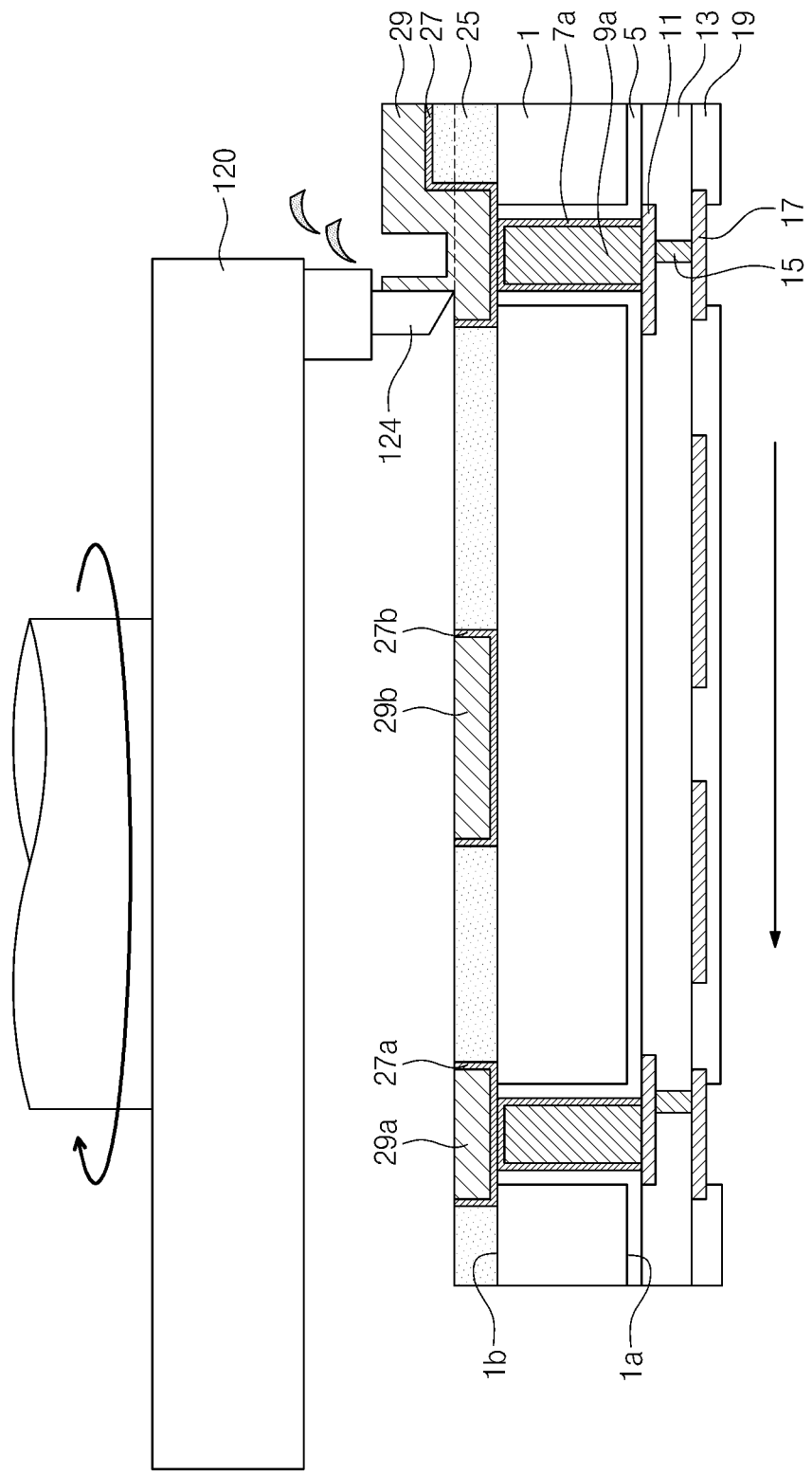
Figure 11:
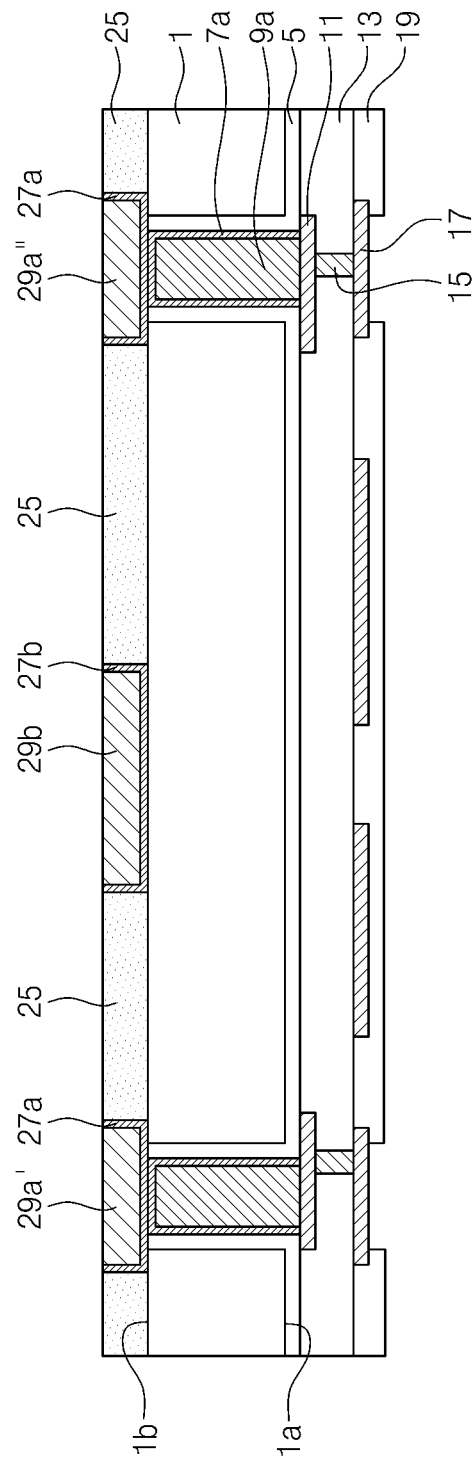

Referring to FIGS. 10 and 11, a portion of the rerouting conductive layer 29 and the external seed layer 27 are removed from the second surface 1b through a planarization process. The planarization process may be performed using a diamond cutter 124 connected to one end portion of a rotating disk 120. In another embodiment, the planarization process may be performed using chemical-mechanical planarization. The type of planarization process used in the invention is not limiting. A portion of the top of the organic insulation pattern 25 may also be removed through the planarization process. The organic insulation pattern 25 may have a thickness of 2 μm or more through the planarization process. In the planarization process, the semiconductor substrate 1 may move horizontally. The first and second rerouting patterns 29a and 29b and the external seed layer patterns 27a and 27b are formed through the planarization process. In one embodiment, an electrical connection between one of the first rerouting patterns 29a and the through via 9a is formed after the planarization process.

In one example of a method of manufacturing an exemplary semiconductor device, the organic insulation pattern 25 is formed on the semiconductor device before the external seed layer patterns 27a and 27b are formed. In one embodiment, the organic insulation pattern 25 is patterned to form openings, and a blanket deposition of the external seed layer 27 is performed across the surface. The external seed layer 27 is deposited within openings formed in the organic insulation pattern 25, which may include the bottom of the openings and/or sidewalls of the openings. After deposition of the rerouting conductive layer 29 and subsequent planarization, the external seed layer patterns 27a and 27b may be disposed on the bottom and/or along the sidewalls of those openings. The rerouting patterns 29a and 29b are formed in the openings, such that the external seed layers 27a and 27b are disposed between the first and second rerouting patterns 29a and 29b and the organic insulation pattern 25.

By forming the organic insulation layer 25 and then forming the external seed layer patterns 27a and 27b, an undercut may be avoided when portions of the external seed layer 27 are removed during the semiconductor device fabrication (as shown in FIG. 10). A gap or undercut between the first and second rerouting patterns 29a and 29b and the substrate 1 may be avoided or lessened when the portion of the external seed layer 27 that is removed is not in contact with the substrate 1. By forming the organic insulation pattern 25 before the external seed layer patterns 27a and 27b, the delamination problems that might otherwise occur because of an undercut are reduced.

Figure 12:
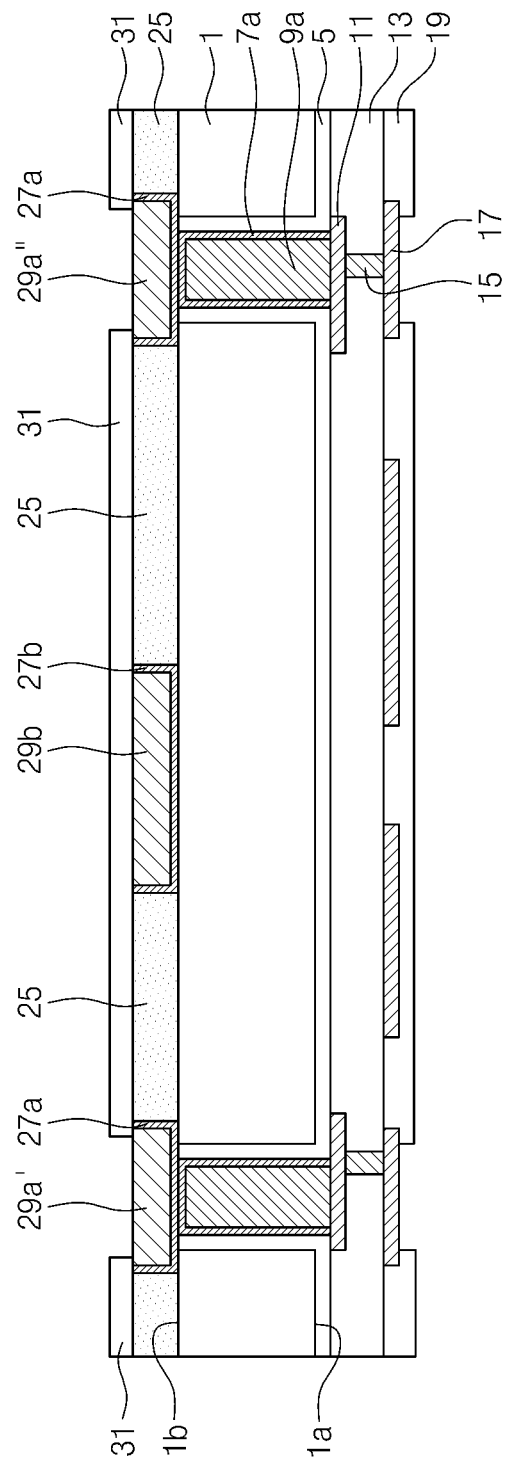

Referring to FIG. 12, a second passivation layer 31 is formed. In the embodiment depicted in FIG. 12, the second passivation layer 31 may expose a portion of the first rerouting patterns 29a. The second passivation layer 31 may cover the second rerouting pattern 29b, the external seed layer patterns 27a and 27b, and the organic insulation pattern 25 on the second surface 1b of the semiconductor substrate 1.

Subsequently, the semiconductor device 100 of FIG. 1 may be completed by attaching a bump 35 to the exposed first rerouting patterns 29a and then performing a singulation process.

Second Embodiment

Figure 13:
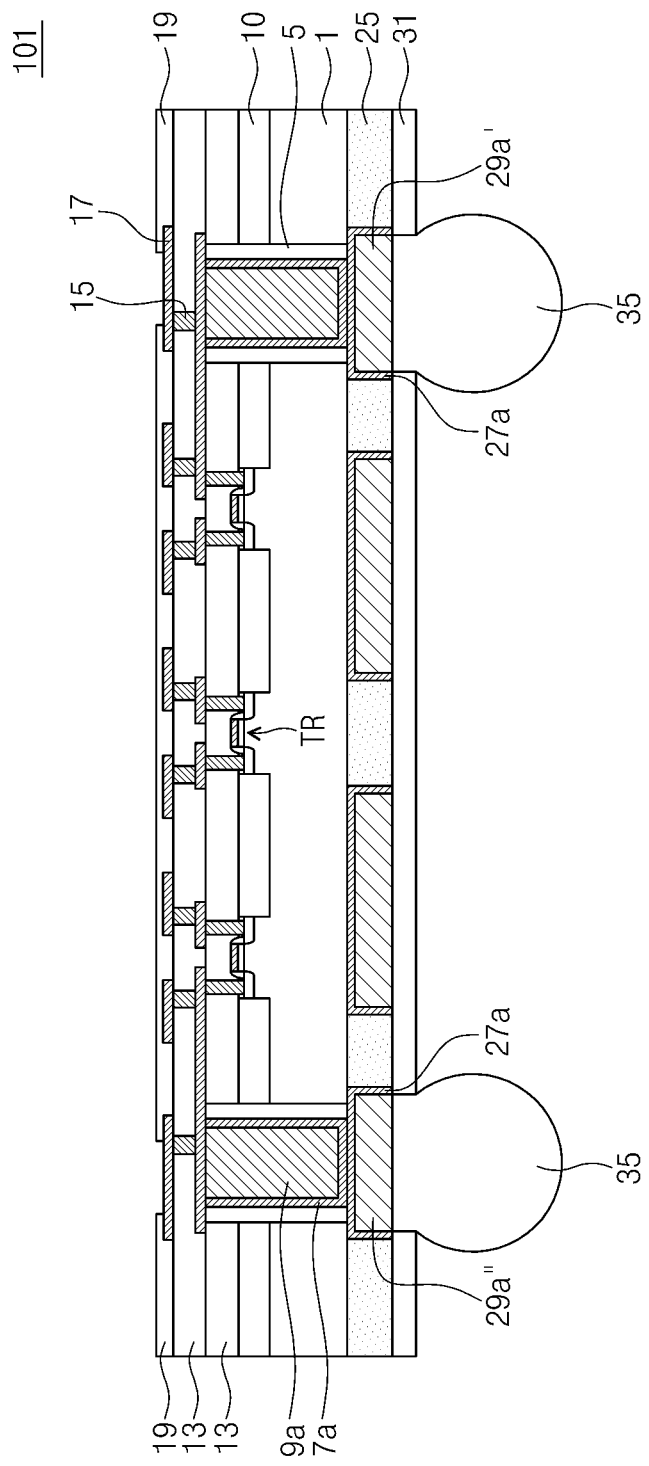
FIG. 13 is a sectional view of a semiconductor device according to an embodiment.

FIG. 13 is a sectional view of an exemplary semiconductor device according to another embodiment.

Referring to FIG. 13, a semiconductor device 101 may include an isolation layer 10 and internal devices such as a plurality of transistors TR. The semiconductor device 101 may be not interposer but may be a memory chip or logic chip. In all other aspects, the configuration and forming method may be identical or similar to that of semiconductor device 100.

Third Embodiment

Figure 14:
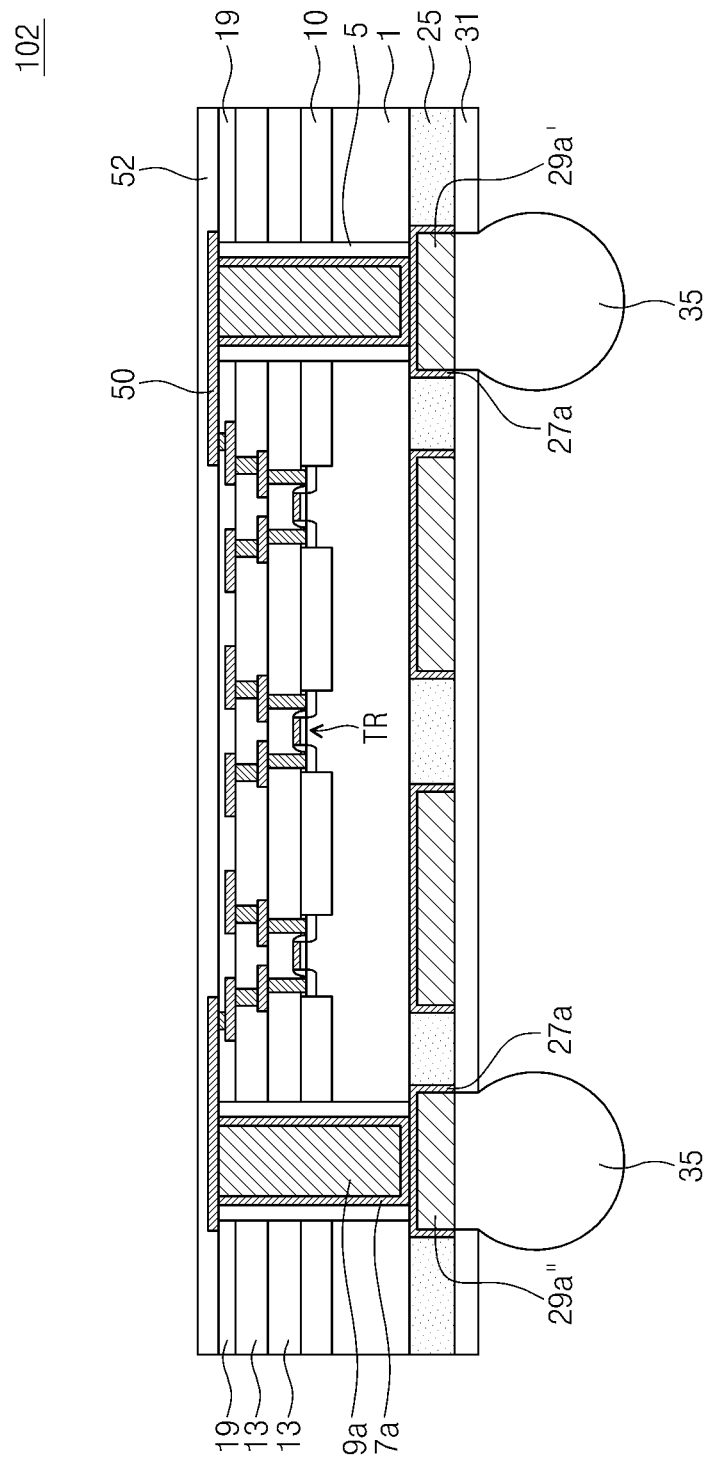
FIG. 14 illustrates a sectional view of a semiconductor device according to an embodiment.

FIG. 14 illustrates a sectional view of a semiconductor device according to another embodiment.

Referring to FIG. 14, in a semiconductor device 102, a through via 9a may project onto the semiconductor substrate 1 to pass through interlayer dielectrics 13 and a first passivation layer 19. The through via 9a is connected to a front rerouting pattern 50. The front rerouting pattern 50 is covered by a protective layer 52. In all other aspects, the configuration and forming method may be identical or similar to that of semiconductor device 101.

Fourth Embodiment

Figure 15:
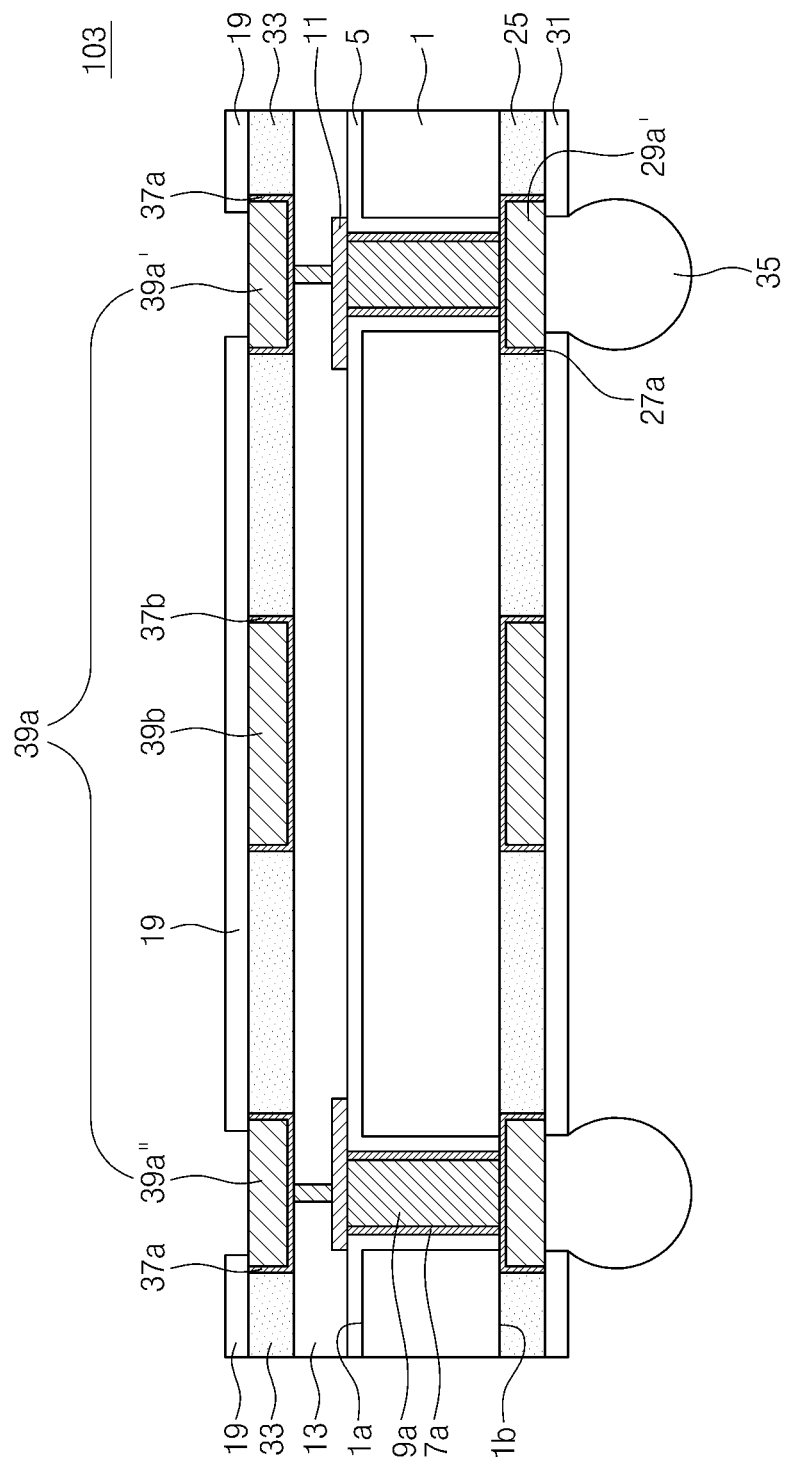
FIG. 15 is a sectional view of a semiconductor device according to an embodiment.

FIG. 15 is a sectional view of an exemplary semiconductor device according to another embodiment.

Referring to FIG. 15, in a semiconductor device 103, rerouting patterns 29a, 29b, 39a, and 39b are disposed on both surfaces 1a and 1b of the substrate 1.

In detail, a plurality of internal routings 11, a contact 15, and an interlayer dielectric 13 may be disposed on the first surface 1a of the substrate 1. Upper organic insulation patterns 33 may be disposed on the interlayer dielectric 13. The upper organic insulation patterns 33 may be formed with openings. First and second upper rerouting patterns 39a and 39b may be disposed in the openings of the upper organic insulation patterns 33, with first and second upper seed layer patterns 37a and 37b disposed therebetween. The formation of the upper organic insulation patterns 33, the first and second upper rerouting patterns 39a and 39b and the first and second upper seed layers 37a and 37b are discussed further below. Although not shown, a passivation layer may be disposed at the first surface 1a so that the passivation layer may be interposed between the substrate 1 and the first and second upper rerouting patterns 39a and 39b.

The first upper rerouting patterns 39a may include one or more upper rerouting patterns; in one embodiment, first upper rerouting patterns 39a include a first upper rerouting pattern 39a' and a first upper rerouting pattern 39a". The number of first upper rerouting patterns 39a is not limited herein; the number of first upper rerouting patterns is any number suitable for use in the semiconductor device being formed. The first upper rerouting patterns 39a may be a bonding pad or ball land. The second upper rerouting pattern 38b may be a signal line. The second upper rerouting pattern 39b may connect the first upper rerouting patterns 29a to form electrical circuits.

A first upper seed layer pattern 37a may be disposed between the first upper rerouting patterns 39a and the upper organic insulation pattern 33 and between the first upper rerouting patterns 39a and the interlayer dielectric 13. A second upper seed layer pattern 37b may be disposed between the second upper rerouting patterns 39b and the upper organic insulation pattern 33 and between the second upper rerouting patterns 39b and the interlayer dielectric 13. A first passivation layer 19 may be disposed on the upper organic insulation pattern 33. Lower organic insulation patterns 25, first and second lower rerouting patterns 29a and 29b, and lower seed layer patterns 27a and 27b may be disposed at the second surface 1b of the substrate 1. A second passivation pattern 31 may be disposed at the bottom of the lower organic insulation patterns 25. The upper and lower organic insulation patterns 33 and 25 may be formed of the same material. The first and second upper rerouting patterns 39a and 39b, and the first and second lower rerouting patterns 29a, and 29b may be formed of the same material. The upper and lower seed layer patterns 37a, 37b, 27a, and 27b may be formed of the same material.

The semiconductor device 103 may be an interposer. The interposer may have integrated circuitry (e.g., logic circuitry) formed within or simply consist of a semiconductor substrate with electrical connections (e.g., as described herein).

According to another embodiment, when the first and second upper rerouting patterns and the first and second lower rerouting patterns 29a, 29b, 39a, and 39b are disposed at both surfaces of the substrate 1 in the interposer, the first and second upper rerouting patterns and the first and second lower rerouting patterns 29a, 29b, 39a, and 39b may have a thickness greater than internal routings 11 and a bonding pad 17, thereby decreasing electric resistance and increasing a signal transmission speed. In this case, total production cost may be reduced.

A method of forming the upper organic insulation pattern 33, the first and second upper rerouting patterns 39a and 39b, and the upper seed layer patterns 37a and 37b may be identical or similar to that of the organic insulation pattern 25, first and second rerouting patterns 29a and 29b, and seed layer patterns 27a and 27b described with reference to FIGS. 8 and 11. In all other aspects, the configuration and forming method may be identical or similar to that of the semiconductor device 100.

For example, in a method of manufacturing an exemplary semiconductor device, the upper organic insulation pattern 33 is formed on the semiconductor device before the upper seed layer patterns 37a and 37b are formed. In one embodiment, the upper organic insulation pattern 33 is patterned to form openings, and the external seed layer 37 is blanket deposited on the upper organic insulation pattern 33 including within the openings (e.g., at the bottom and/or sidewalls of the openings). After deposition of the rerouting conductive layer 29 and subsequent planarization, the upper seed layer patterns 37a and 37b are formed. The upper seed layer patterns 37a and 37b may be disposed on the bottom and/or along the sidewalls of the openings defined by the upper organic insulation pattern 33. The first and second upper rerouting patterns 39a and 39b are formed in the openings, such that the upper seed layers 37a and 37b are disposed between the first and second upper rerouting patterns 39a and 39b and the upper organic insulation pattern 33.

By forming the upper organic insulation layer 33 and then forming the upper seed layer patterns 37a and 37b, an undercut may be avoided when portions of the external seed layer 37 (not shown) are removed during the semiconductor device fabrication. A gap between the first and second upper rerouting patterns 39a and 39b and the substrate 1 may be reduced or eliminated when the portion of the external seed layer 37 that is removed is not in contact with the substrate 1. By forming the upper organic insulation pattern 33 before the upper seed layer patterns 37a and 37b, the delamination problems that might otherwise occur because of an undercut may be reduced or eliminated.

In one embodiment, the semiconductor devices 100, 101, 102, and 103 may become a wafer level package in and of themselves. Alternatively, the semiconductor devices 100, 101, 102, and 103 may be applied as an element in a semiconductor package.

<First Package Embodiment>

Figure 16:
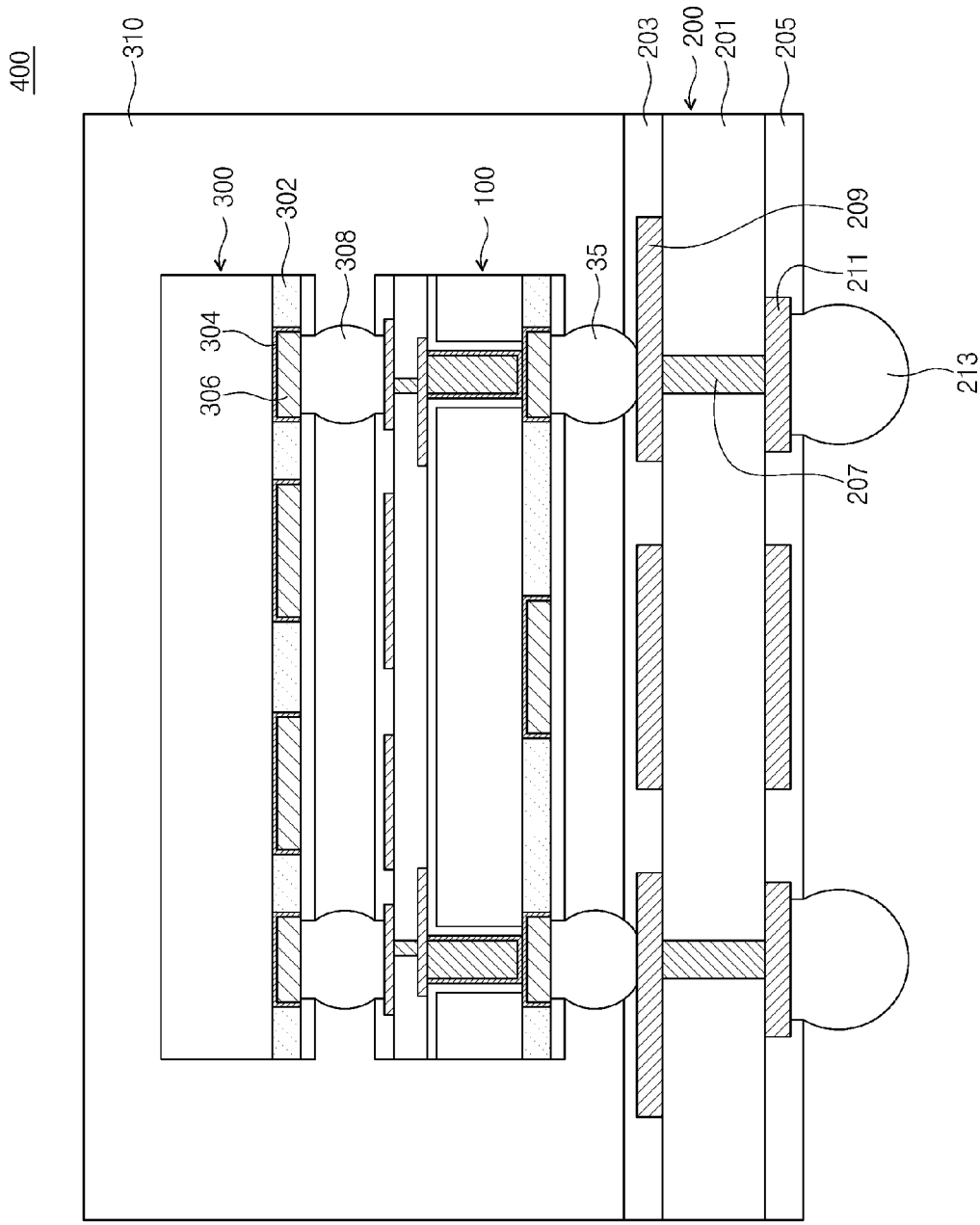
FIG. 16 illustrates a semiconductor package according to a package embodiment.

FIG. 16 illustrates a semiconductor package according to a package embodiment.

Referring to FIG. 16, a semiconductor package 400 may include a package substrate 200, and first and second semiconductor devices 100 and 300 mounted on the package substrate 200. The package substrate 200 may be a printed circuit board. The package substrate 200 may include an insulation substrate 201, a package substrate through via 207 that may penetrate the insulation substrate 201, conductive patterns 209 and 211 disposed at a top and a bottom of the insulation substrate 201, and package substrate insulation layers 205 and 203 that may partially cover the conductive patterns 209 and 211.

The first semiconductor device 100 may correspond to the semiconductor device 100 of FIG. 1. The second semiconductor device 300 may correspond to a memory chip or logic chip. A chip organic insulation pattern 302, a chip seed layer pattern 304, and a chip rerouting pattern 306 may be disposed at the bottom of the second semiconductor device 300. The chip organic insulation pattern 302, chip seed layer pattern 304, and chip rerouting pattern 306 may correspond to the organic insulation pattern 25, first external seed layer pattern 27a, and first rerouting pattern 29a of FIG. 1, respectively. The second semiconductor device 300 may not include a through via.

The first and second semiconductor devices 100 and 300 may be mounted on the package substrate 200 in a flip-chip bonding process. In one embodiment, the first semiconductor device 100 may be electrically connected to the package substrate 200 by a first bump 35. The second semiconductor device 300 may be electrically connected to the first semiconductor device 100 by a second bump 308. The first semiconductor device 100 may serve as an interposer in the semiconductor package 400. A third bump 213 may be adhered to the bottom of the package substrate 200. The bumps 35, 308, and 213 may be solder balls and have the same size or different sizes. The semiconductor package 400 may further include a mold layer 310 covering the first and second semiconductor devices 100 and 300.

<Second Package Embodiment>

Figure 17:
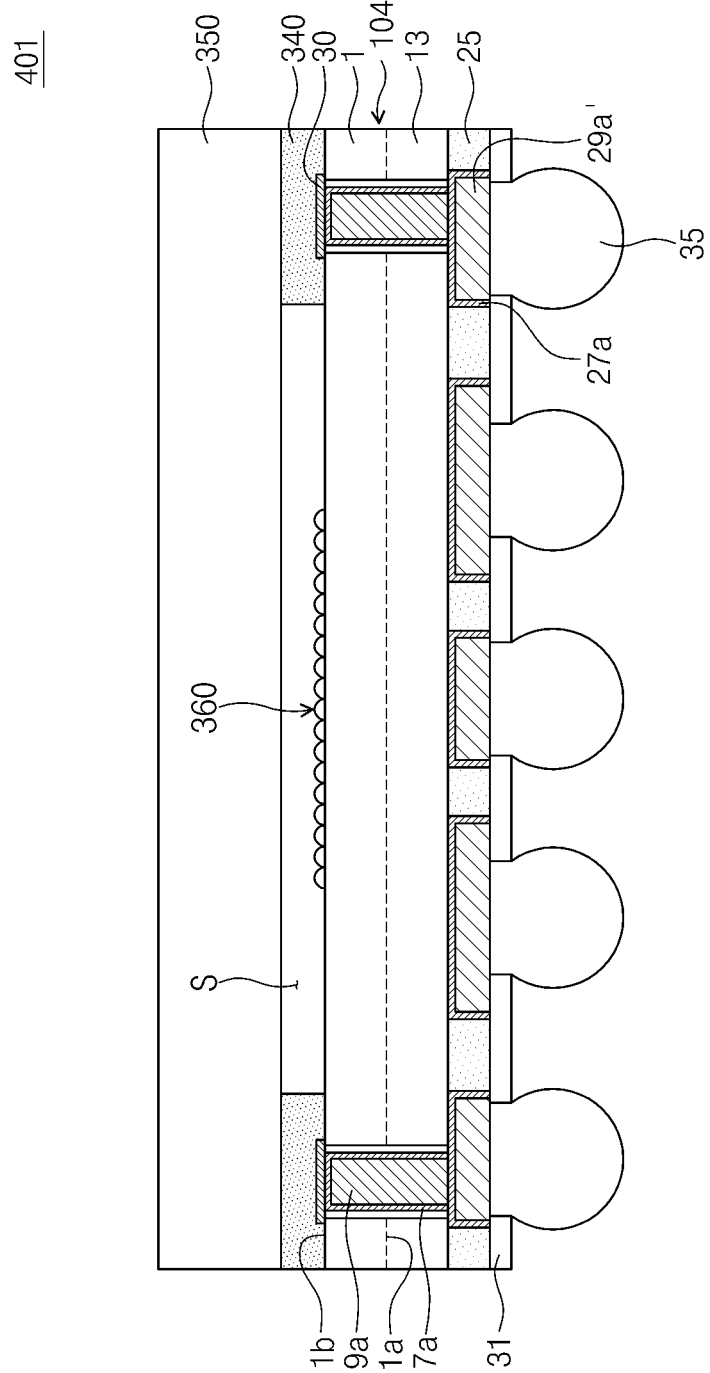
FIG. 17 illustrates a semiconductor package according to a package embodiment.

FIG. 17 illustrates a semiconductor package according to another package embodiment.

Referring to FIG. 17, a semiconductor package 401, as a kind of semiconductor chip, may include an image sensor chip 104. The image sensor chip 104 may include a pixel region (not shown) where a plurality of unit pixels are disposed in the substrate 1. The substrate 1 may include mutually opposite first and second surfaces 1a and 1b. The image sensor chip 104 may include routings and transistors (not shown) for electrically transmitting signals generated in pixels, and interlayer dielectrics 13 that may cover the routings and transistors. In this package embodiment, the image sensor chip 104 may be a backside illumination image sensor. Micro lenses 360 that are respectively overlapped with unit pixels may be disposed on the second surface 1b of the substrate 1. A transparent substrate 350 may be disposed on the image sensor chip 104, and an adhesive pattern 340 may be disposed at the edges between the transparent substrate 30 and the image sensor chip 104. Thus, an empty space S may be provided between the transparent substrate 30 and the image sensor chip 104. The image sensor chip 104 may also include a through via 9a. The through via 9a may be contacted with a bonding pad 30 through the substrate 1 and interlayer dielectrics 13 of the image sensor chip 104. An organic insulation pattern 25, rerouting patterns 29a, and external seed layer pattern 27a may be disposed at the bottom of the interlayer dielectric 13.

The semiconductor package 401 of FIG. 17 may be formed by the following method. First, an image sensor chip 104 (in which a through via 9a is not formed) may be formed. Next, a transparent substrate 350 may be adhered onto the image sensor chip 104 with an adhesive pattern 340. A through hole 3 may be formed on the back side of the image sensor chip 104, and a through via 9a may be formed. An organic insulation pattern 25, rerouting patterns 29a, and external seed layer patterns 27a may be formed in a manner similar to the method described with reference to FIGS. 8 to 11. Subsequently, the semiconductor package 401 may be completed by attaching a solder ball 35 and then performing a singulation process.

<Third Package Embodiment>

Figure 18:
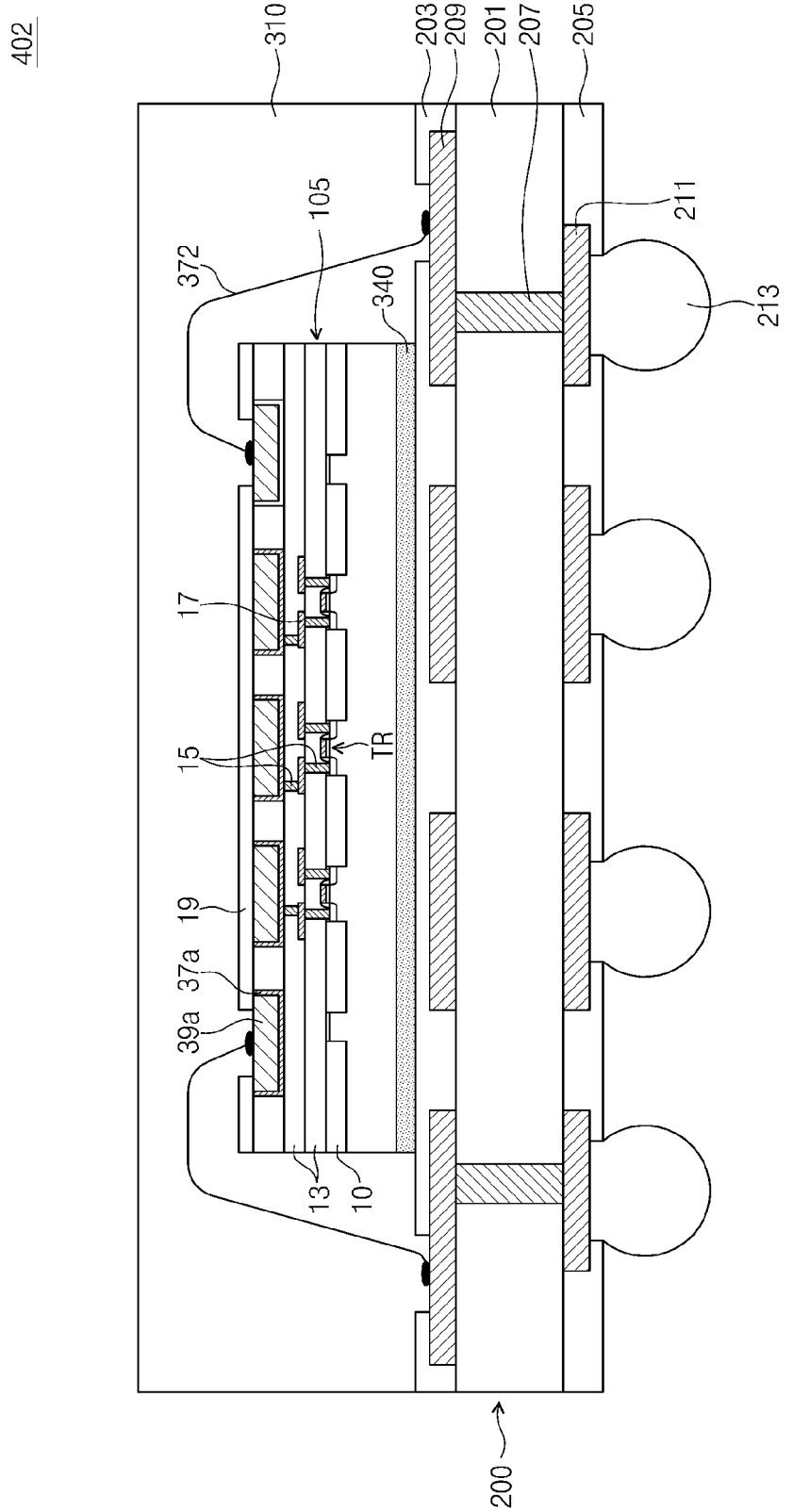
FIG. 18 illustrates a semiconductor package according to a package embodiment.

FIG. 18 illustrates a semiconductor package according to another package embodiment.

Referring to FIG. 18, in a semiconductor package 402, a semiconductor device 105 may be mounted on a package substrate 200. The semiconductor device 105 may not include a through via. An upper rerouting pattern 39a disposed at the top of the semiconductor device 105 may be connected to a conductive pattern 209 of the package substrate 200 by a wire 372. In one embodiment, the semiconductor device 105 may be mounted on the package substrate 200 in a wire bonding process. The semiconductor device 105 may be adhered to the package substrate 200 by the adhesive pattern 340.

The semiconductor package technology described above may be applied to various kinds of semiconductors and to a package module including the semiconductors.

Figure 19:
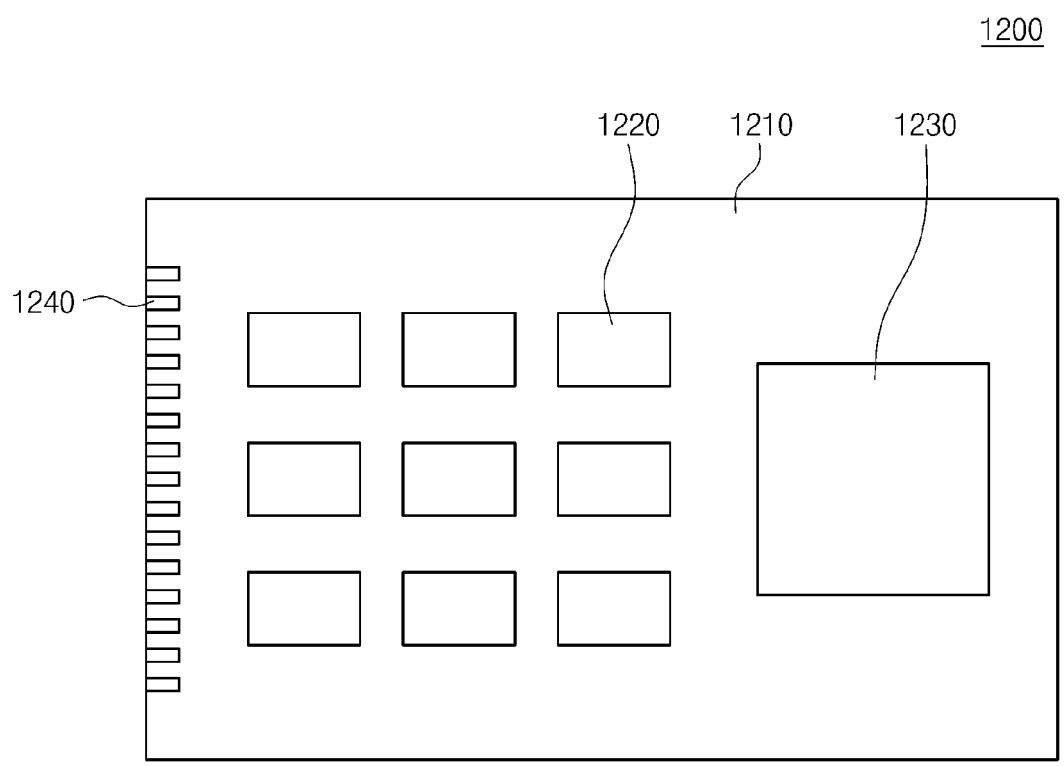
FIG. 19 is a view illustrating a package module including a semiconductor package.

FIG. 19 is a view illustrating an exemplary package module including an exemplary semiconductor package. Referring to FIG. 19, the package module 1200 may include a semiconductor integrated circuit chip 1220 and a Quad Flat Package (QFP) semiconductor integrated circuit chip 1230. The semiconductor chips 1220 and 1230 may apply the exemplary semiconductor package technology disclosed herein. By disposing the semiconductor integrated circuit chips 1220 and 1230 on the substrate 1210, the package module 1200 may be formed. The package module 1200 may be connected with an external electric device through an external connection terminal 1240 at one side of the substrate 1210.

Figure 20:
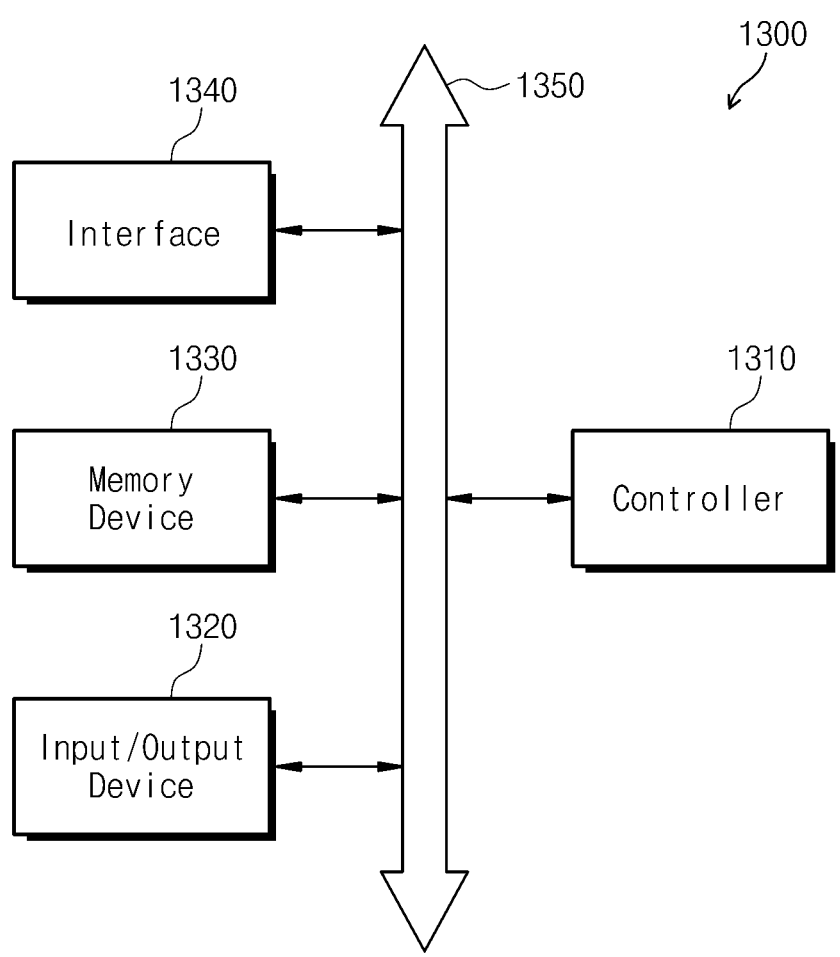
FIG. 20 is a block diagram illustrating an electronic device including a semiconductor package.

The semiconductor package technology described above may be applied to an electronic system. FIG. 20 is a block diagram illustrating an electronic device including an exemplary semiconductor package.

Referring to FIG. 20, an electronic system 1300 may include a controller 1310, an input/output device 1320, and a memory device 1330. The controller 1310, input/output device 1320, and memory device 1330 may be combined through a bus 1350. The bus 1350 may be a path for transferring data. For example, the controller 1310 may include at least one of a microprocessor, digital signal processor, and microcontroller, or at least one of logical devices for performing the same function thereof. The controller 1310 and the memory device 1330 may include an exemplary semiconductor package. The input/output device 1320 may include at least one of a key pad, key board, and display device.

The memory device 1330 may be a device for storing data. The memory device 1330 may store data and/or commands to be executed by the controller 1310. The memory device 1330 may include a volatile memory device and/or nonvolatile memory device. The memory device 1330 may be formed with a flash memory. For example, a flash memory formed by applying the technology set forth herein may be equipped with an information processing system such as a mobile device or desktop computer. Such flash memory may be configured with a semiconductor disk device (SSD). In this case, the electronic system 1300 may stably store a large amount of data in the flash memory system.

The electronic system 1300 may further include an interface 1340 for transmitting/receiving data to/from a communication network. The interface 1340 may be wired or wireless. For example, the interface 1340 may include an antenna or wired/wireless transceiver. However, it is obvious to those skilled in the art that the electronic system 1300 may further include an application chipset, a camera image processor (CIS), and input/output device (not shown).

The electronic system 1300 may be implemented with a mobile system, a personal computer, an industrial computer, or a logic system for performing various functions. For example, the mobile system may be one of a personal digital assistant (PDA), portable computer, web tablet, mobile phone, wireless phone, laptop computer, memory card, digital music system, and information transmission/reception system. When the electronic system 1300 is an apparatus for performing wireless communication, the electronic system 1300 may be used in the third generation communication interface protocol such as CDMA, GSM, NADC, E-TDMA, WCDMA, and CDMA2000.

In an exemplary semiconductor device, the organic insulation pattern may be disposed between the rerouting patterns. The organic insulation pattern may absorb the physical stress that occurs when the rerouting patterns are expanded by heat. Therefore, flexibility can be increased. Since the organic insulation pattern may be disposed between the rerouting patterns, insulating properties can be increased relative to a semiconductor device in which a semiconductor pattern is disposed between the rerouting patterns.

Since a seed layer pattern may be disposed between the rerouting patterns and the organic insulation pattern and between the rerouting patterns and the substrate, the adhesive strength of the rerouting pattern is enhanced, thereby improving the delamination limitation. As explained above, the formation of the organic insulation pattern before the seed layer pattern may prevent or lessen the formation of an undercut, thereby also reducing delamination problems. Also, the seed layer pattern may prevent the metal that forms the rerouting patterns from being diffused to the organic insulation pattern. Therefore, an exemplary semiconductor device with enhanced reliability may be implemented.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be determined by the broadest permissible interpretation of the following claims and their equivalents, and shall not be restricted or limited by the foregoing detailed description.

What is claimed is:

1. A semiconductor device comprising:
   a semiconductor substrate having an active surface at which an integrated circuit is formed and a backside surface opposite the active surface;
   a first organic insulation pattern disposed on the backside surface, the first organic insulation pattern having at least a first opening;
   a first seed layer pattern disposed on sidewalls of the first opening of the first organic insulation pattern;
   an electroplated conductive pattern formed within the opening, the seed layer being disposed between the conductive pattern and the sidewalls of the opening, the conductive pattern comprising at least one of a chip pad and a wiring; and
   a through substrate via extending through the semiconductor substrate and electrically connected to the conductive pattern, wherein the first organic insulation pattern comprises a polymer that is flexible.

2. The semiconductor device of claim 1, wherein the conductive pattern is planarized.

3. The semiconductor device of claim 1, wherein the first organic insulation pattern comprises a polyimide.

4. The semiconductor device of claim 1, wherein the conductive pattern has a thickness of 2 μm or more.

5. The semiconductor device of claim 1, wherein the first organic insulation pattern has a thickness of 2 μm or more.

6. A semiconductor device comprising:
   a semiconductor substrate having an active surface at which an integrated circuit is formed and a backside surface opposite the active surface;
   a first organic insulation pattern disposed on the backside surface, the first organic insulation pattern having at least a first opening;
   a first seed layer pattern disposed on sidewalls of the first opening of the first organic insulation pattern;
   an electroplated conductive pattern formed within the opening, the seed layer being disposed between the conductive pattern and the sidewalls of the opening, the conductive pattern comprising at least one of a chip pad and a wiring;
   a through substrate via extending through the semiconductor substrate and electrically connected to the conductive pattern;
   a second organic insulation pattern disposed on the active surface, the second organic insulation pattern having at least a first opening;
   a second seed layer pattern disposed on sidewalls of the first opening of the second organic insulation pattern; and
   a second conductive pattern formed within the opening, the seed layer being disposed between the second conductive pattern and the sidewalls of the opening, the second conductive pattern comprising at least one of a chip pad and a wiring.

7. The semiconductor device of claim 1, further comprising an internal routing on the active surface, wherein the conductive pattern has a thickness greater than that of the internal routing.

8. A semiconductor device comprising:
   a semiconductor substrate having an active surface at which an integrated circuit is formed and a backside surface opposite the active surface;
   a first organic insulation pattern disposed on the backside surface, the first organic insulation pattern having at least a first opening;
   a first seed layer pattern disposed on sidewalls of the first opening of the first organic insulation pattern;
   an electroplated conductive pattern formed within the opening, the seed layer being disposed between the conductive pattern and the sidewalls of the opening, the conductive pattern comprising at least one of a chip pad and a wiring;
   a through substrate via extending through the semiconductor substrate and electrically connected to the conductive pattern; and
   at least a first transistor electrically connected to the conductive pattern.

9. A semiconductor package comprising:
   the semiconductor device of claim 1; and
   a package substrate on which the semiconductor device is mounted.

10. The semiconductor package of claim 9, further comprising:
    a transparent substrate disposed on the semiconductor device; and
    an adhesive pattern disposed between the semiconductor device and the transparent substrate.

11. The semiconductor device of claim 1, wherein the through substrate via is vertically aligned with the electroplated conductive pattern.

12. The semiconductor device of claim 6, wherein the through substrate via is vertically aligned with the electroplated conductive pattern.

13. The semiconductor device of claim 8, wherein the through substrate via is vertically aligned with the electroplated conductive pattern.

14. A semiconductor package comprising:
    the semiconductor device of claim 8;
    a package substrate on which the semiconductor device is mounted;
    a transparent substrate disposed on the semiconductor device; and
    an adhesive pattern disposed between the semiconductor device and the transparent substrate.

* * * * *